US007488961B2

(12) United States Patent
Muramatsu et al.

(10) Patent No.: US 7,488,961 B2
(45) Date of Patent: Feb. 10, 2009

(54) CHARGED PARTICLE BEAM IRRADIATION METHOD AND CHARGED PARTICLE BEAM APPARATUS

(75) Inventors: Masashi Muramatsu, Chiba (JP); Tomokazu Kozakai, Chiba (JP); Ryoji Hagiwara, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 287 days.

(21) Appl. No.: 11/586,232

(22) Filed: Oct. 25, 2006

(65) Prior Publication Data

US 2007/0114462 A1    May 24, 2007

(30) Foreign Application Priority Data

Oct. 31, 2005    (JP)    ............... 2005-316550

(51) Int. Cl.
*A61N 5/00*    (2006.01)
*H01J 37/302*    (2006.01)

(52) U.S. Cl. ............... 250/492.22; 250/492.2; 250/396 R; 250/398; 250/310

(58) Field of Classification Search ............ 250/492.22, 250/492.2, 396 R, 310, 398
See application file for complete search history.

(56) References Cited

U.S. PATENT DOCUMENTS 4,421,988 A * 12/1983 Robertson et al. ........ 250/492.2
4,439,681 A * 3/1984 Norioka et al. ............. 250/310
4,607,167 A * 8/1986 Petric ....................... 250/492.2
4,820,928 A * 4/1989 Ooyama et al. ........... 250/492.2
2006/0245636 A1* 11/2006 Kitamura et al. ............ 382/149
2007/0075887 A1* 4/2007 Stovall et al. ................ 341/155
2007/0159662 A1* 7/2007 Kobaru et al. ............... 358/401
2008/0160431 A1* 7/2008 Scott et al. ...................... 430/5
2008/0224063 A1* 9/2008 Parker .................. 250/396.6 R

FOREIGN PATENT DOCUMENTS

JP    06-214376    8/1994

\* cited by examiner

*Primary Examiner*—Jack I Berman
*Assistant Examiner*—Johnnie L Smith, II
(74) *Attorney, Agent, or Firm*—Brinks Hofer Gilson & Lione

(57) ABSTRACT

A computer sets a process area based on an image obtained by observing a mask, and determines the positions of representative points that form a contour of the process area for each pixel with sub-pixel accuracy that is better than a pixel, the position of each of the representative points being able to be set to either the center position of the pixel or a position displaced therefrom. Furthermore, for the pixels within the process area, the computer sets the center positions of the pixels as the representative points and corrects the positions of the representative points of the pixels within the process area on a sub-pixel basis such that nonuniformity between the representative points is reduced. When the mask is processed, the charged particle beam is applied with sub-pixel accuracy to the positions of the representative points that form the contour for the pixels that includes the contour of the process area and to the positions of the corrected representative points for the pixels within the process area.

5 Claims, 5 Drawing Sheets

CHARGED PARTICLE BEAM IRRADIATION METHOD AND CHARGED PARTICLE BEAM APPARATUS

This application claims priority under 35 U.S.C. § 119 to Japanese Patent Application No. JP2005-316550 filed Oct. 31, 2005, the entire content of which is hereby incorporated by reference.

BACKGROUND OF THE INVENTION

The present invention relates to a charged particle beam irradiation method and a charged particle beam apparatus.

Conventionally, when an insulator workpiece is observed or processed by a charged particle beam, such as an ion beam or electron beam, the irradiation beam is raster scanned and positioned on the workpiece. Raster scanning is how to sequentially irradiate an array of points.

FIG. 7 shows a raster scan-based processing of a workpiece. As shown in FIG. 7, when the workpiece is processed, the charged particle beam is applied to the center positions of the pixels that are on a contour line of a process area as well the pixels within the process area (the process area means the area which is to be processed from now on) that are not on the contour line. A pixel used herein is a minimum unit area for beam irradiation and an area divided in the horizontal (X) and vertical (Y) directions at an interval corresponding to a minimum unit of irradiation beam deflection. However, in general, since the process area is not always rectangular, especially when the contour line of the process area is a diagonal line that overlies pixels across two rows, a step is unfortunately formed halfway through the process pattern contour, which should be a straight line.

As a technology to solve the above problem, there has been proposed a beam irradiation method in which a process area is expressed as raster data by displacing the position of a specific contour line such that the contour line can be expressed as a straight line and the bit map is displaced by the same amount in the opposite direction (see, for example, JP-A-6-214376).

FIG. 8 shows a processing method using this technique. In the figure, the diagonal contour line is displaced such that the contour line will not included in pixels in the same row, thereby preventing step generation halfway through the process pattern contour.

When a process area has multiple contour lines for which step generation should be avoided, the method described in the patent document 1 has limited applications because the offset positions at which step generation can be avoided for the contour lines do not always coincide. This method is also problematic in that a contour line that should be diagonal becomes vertical or horizontal, and although a contour line for which a step has been eliminated becomes more accurate, other parts may become less accurate.

The invention has been made in view of such situations and aims to provide a charged particle beam irradiation method and a charged particle beam apparatus capable of improving accuracy of process pattern contour lines independent of the shape of a process area of a workpiece.

SUMMARY OF THE INVENTION

The invention has been made to solve the above problems and provides a charged particle beam irradiation method for processing and observing a workpiece by using a charged particle beam apparatus to apply a charged particle beam to a pixel that is a unit area for charged particle beam irradiation, characterized in that the method comprises: setting a process area based on an image obtained by observing the workpiece and determining the positions of representative points that form a contour of the thus set process area for each pixel with sub-pixel accuracy that is better than a pixel, the position of each of the representative points being able to be set to either the center position of the pixel or a position displaced therefrom; and applying the charged particle beam, for the pixels that include the contour of the process area, to the positions of the representative points that form the contour with sub-pixel accuracy.

Another embodiment of the invention is the charged particle beam irradiation method, characterized in that the method further comprises the step of applying the charged particle beam to the center position of a pixel when the pixel is within the process area.

Another embodiment of the invention is the charged particle beam irradiation method, characterized in that the method further comprises the step of, for the pixels within the process area, correcting the positions of representative points for each row and column with sub-pixel accuracy such that intervals between the representative points of the pixels in a same row or column become uniform, and applying the charged particle beam to the positions of the corrected representative points.

The invention provides a charged particle beam apparatus for processing and observing a workpiece by applying a charged particle beam to a pixel that is a unit area for charged particle beam irradiation, characterized in that the apparatus comprises: representative point setting means that sets a process area based on an image obtained by observing the workpiece, and determines the positions of representative points that form a contour of the thus set process area for each pixel with sub-pixel accuracy that is better than a pixel, the position of each of the representative points being able to be set to either the center position of the pixel or a position displaced therefrom; and scanning control means that, for the pixels that include the contour of the process area, controls the charged particle beam with sub-pixel accuracy to be applied to the positions of contour-forming representative points determined by the representative point setting means.

Another embodiment of the invention is the charged particle beam apparatus, characterized in that the apparatus further comprises correction means that, for the pixels within the process area, corrects the positions of representative points for each row and column with sub-pixel accuracy such that intervals between the representative points of the pixels in a same row or column become uniform, the scanning control means controlling the charged particle beam with sub-pixel accuracy to be applied to the positions of the representative points corrected by the correction means.

According to the invention, when a charged particle beam apparatus processes a workpiece, accuracy of a contour line of a process pattern can be improved independent of the shape of a process area of the workpiece. Nonuniformity in charged particle beam irradiation in the process area can be reduced, allowing uniform processing.

DETAILED DESCRIPTION OF THE PREFERRED EMBODIMENTS

Embodiments of the invention will be described in detail below with reference to the drawings.

First Embodiment

Figure 1:
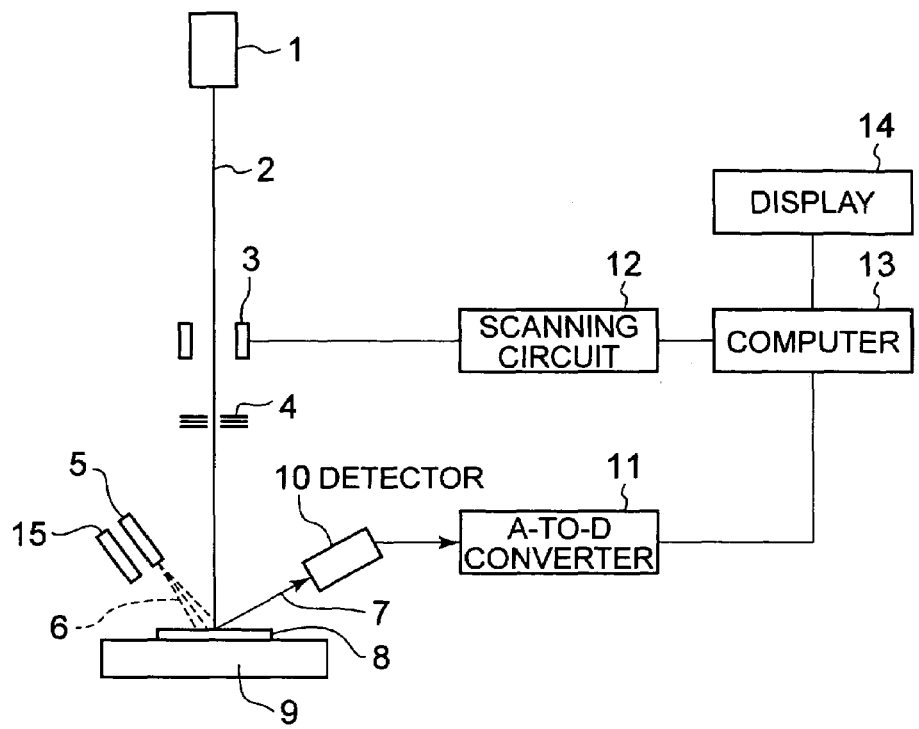
FIG. 1 is a block diagram showing the overall configuration of the charged particle beam apparatus according to the first embodiment.

FIG. 1 shows the overall configuration of a charged particle beam apparatus according to a first embodiment of the invention. Reference number 1 denotes an ion source, which emits an ion beam 2. Reference number 3 denotes scanning electrodes including X and Y electrodes, which scan an irradiation spot over a predetermined range in the X-Y plane of a mask 8, which is a workpiece to which the ion beam 2 is applied. Reference number 4 denotes an objective lens that focuses the ion beam 2 into a spot on an object to be irradiated, which is the surface of the mask 8. Reference number 5 denotes a gas gun that, when a white defect region on the mask 8 is to be repaired, sprays organic compound vapor 6, which is a deposition gas, to deposit a light blocking film to repair the white defect, while the ion beam 2 is selectively scanned and applied to the white defect region.

To repair a black defect region, a gas gun 15 sprays an etching gas onto an unnecessary deposited portion to etch that portion for repair, while the ion beam 2 is selectively applied to that portion. Reference number 9 denotes an X-Y stage, on which the mask 8 is mounted and moved in the X or Y direction. Reference number 10 denotes a detector that detects the intensity of secondary charged particles 7 forced to be emitted from the surface of the mask 8 through irradiation of the ion beam 2. The two-dimensional intensity distribution of the secondary charged particles corresponds to the pattern formed on the mask 8. Reference number 11 denotes an A-to-D converter that converts an analog measurement of the secondary charged particle intensity into digital data. The digital data is inputted in a computer 13, which reproduces an enlarged image of the pattern of the mask 8 and displays it on a display 14. Reference number 12 denotes a scanning circuit that receives an ion beam irradiation range from the computer 13 and controls the scanning electrodes 3.

Figure 2:
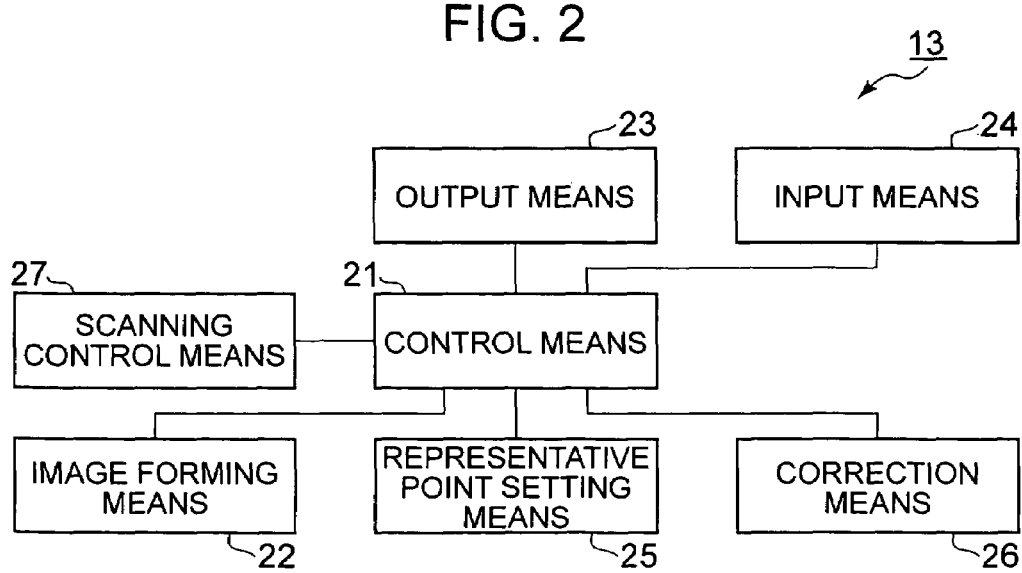
FIG. 2 is a block diagram showing the configuration of the computer according to the first embodiment.

FIG. 2 is a block diagram illustrating the internal configuration of the computer 13 shown in FIG. 1. Only functional blocks relevant to the invention are extracted and shown.

Control means 21 includes a CPU (central processing unit) and various memories and performs various tasks, such as controlling various portions, temporarily storing data, and forwarding data. Image forming means 22 forms an image of a workpiece pattern of the mask 8 based on the intensity of the secondary charged particles 7 detected by the detector 10. Output means 23 displays the image on the display 14. Input means 24 includes a keyboard and a mouse and functions to acquire information inputted by an operator. Representative point setting means 25 sets representative points of pixels on a contour line of a process area as well as pixels within the process area. A pixel used herein is a unit area for irradiation of the ion beam 2. A representative point used herein is a point used to determine a beam irradiation point, i.e., the position to which the beam is applied within a pixel. A representative point is determined with sub-pixel accuracy. The sub-pixel accuracy used herein refers to accuracy better than a pixel and can be used to indicate the position of a point within a pixel. Correction means 26 corrects a representative point with sub-pixel accuracy to eliminate nonuniformity in the amount of beam irradiation within a process area, and determines a beam irradiation point. Scanning control means 27 controls the scanning circuit 12 with sub-pixel accuracy.

Figure 3:
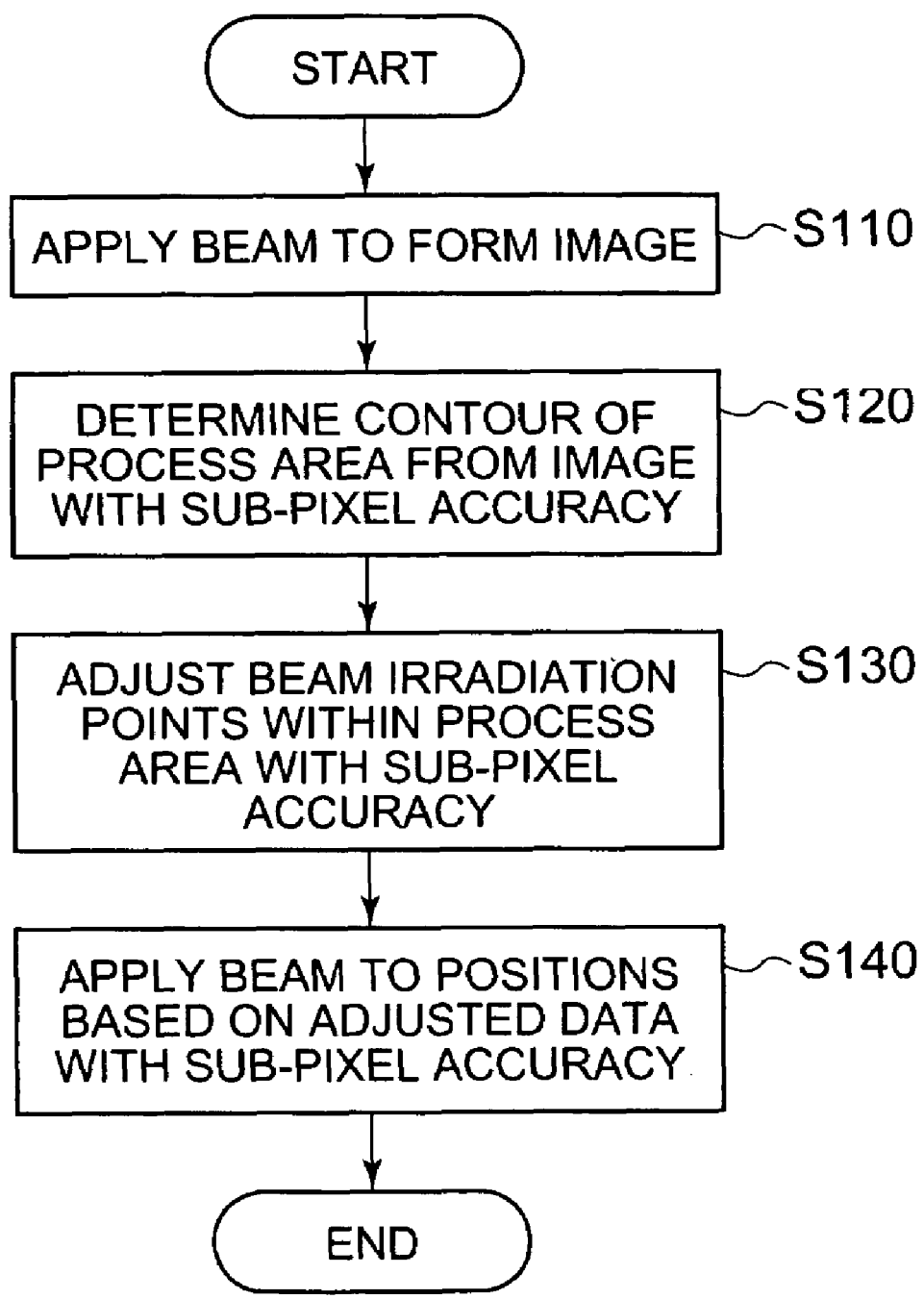
FIG. 3 is a flowchart of the defect correction procedure according to the first embodiment.

FIG. 3 is a flowchart of a defect repair procedure using a charged particle beam apparatus.

The mask 8 to be processed is irradiated with the ion beam 2, and the detector 10 detects the intensity of the secondary charged particles 7 emitted from the mask 8. The image forming means 22 of the computer 13 acquires the intensity of the secondary charged particles 7 detected by the detector 10 via the A-to-D converter 11 to form a workpiece pattern image. The output means 23 enlarges the formed image and displays it on the display 14 (step S10).

Subsequently, the operator uses the input means 24, such as a mouse, to input information for setting a process area for defect repair on the workpiece pattern displayed on the display 14. The representative point setting means 25 sets the process area and determines representative points that forms the contour of the process area with sub-pixel accuracy (step S120). For pixels within the process area that are not on the contour of the process area, their center position are set to representative points by the representative point setting means 25.

The correction means 26 corrects the positions of the representative points of the pixels within the process area with sub-pixel accuracy to eliminate nonuniformity in the amount of beam irradiation in the process area, and sets thus corrected representative points to beam irradiation points (step S130). When the defect region is repaired, the scanning control means 27 controls scanning circuit 12 to apply the ion beam 2 to the positions of the beam irradiation points determined with sub-pixel accuracy in step S130 (step S140).

Detailed descriptions will be given how to set representative points on the contour line of the process area used in the above-mentioned defect repair procedure and how to correct the representative points.

Firstly, a method how the computer 13 determines representative points from an observed image will be described.

Figure 4:
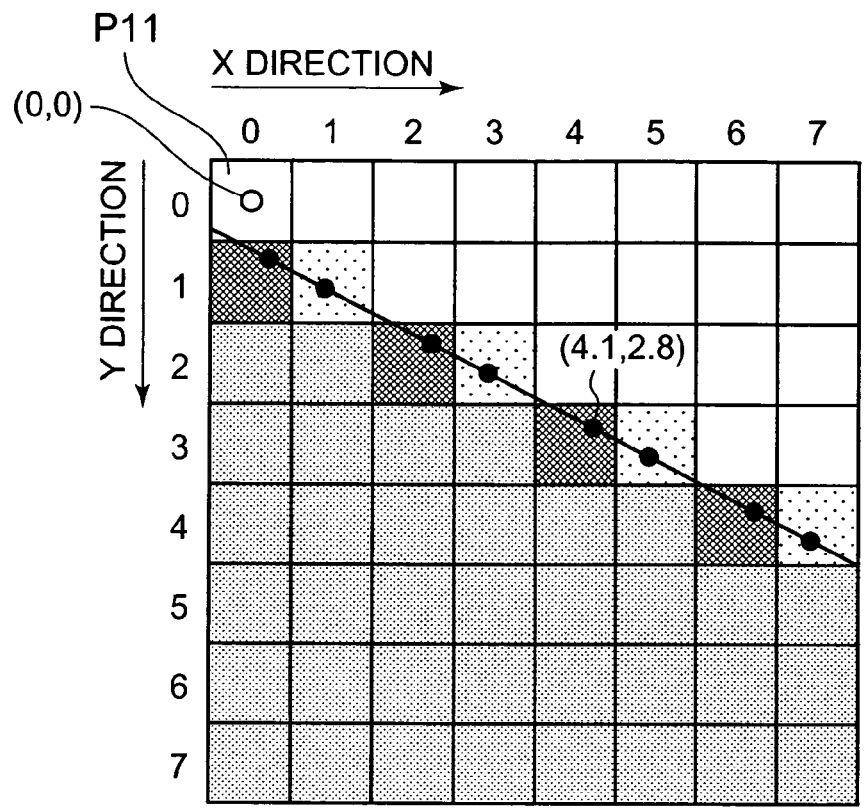
FIG. 4 explains how to determine a representative point from an observed image according to the first embodiment.
Figure 4:
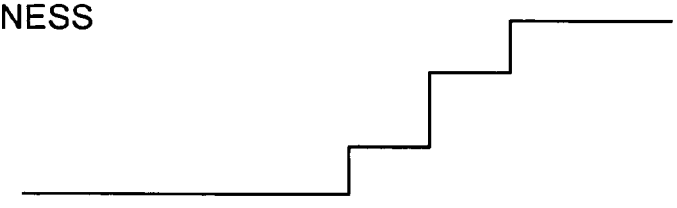
Figure 4:
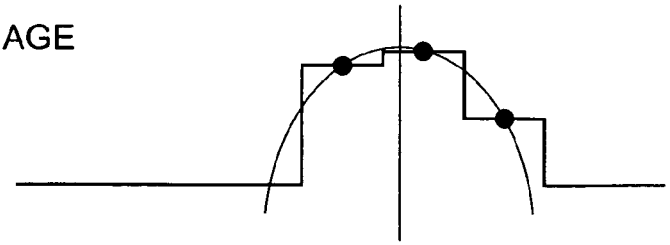

FIG. 4 explains how the computer 13 conventionally determines representative points on a contour line from an image obtained by observing the mask 8.

The image forming means 22 of the computer 13 first observes the mask 8 to create its image on a pixel basis (also referred to as a bitmap). In the following description, the left-to-right direction is the X direction and the up-to-down direction is the Y direction. The position of a representative point may be determined in an XY coordinate system in which the center position of a predetermined pixel is set to (0, 0), or may be determined as a vector indicative of how much and in what direction the representative point is displaced with reference to the center position of the pixel within which the representative point is included.

The representative point setting means 25 of the computer 13 differentiates the change in brightness of each pixel in the formed image for each column and row in the X and Y directions, finds the coordinates of a local maximum, and set it as a representative point on the contour line. In FIG. 4, a local maximum value occurs at X=4.1 for the third row of the Y direction. Using a similar procedure, if a local maximum value occurs at Y=2.8 for the fourth column of the X direction, the position of the representative point is (4.1, 2.8). When a vector indicative of displacement from the center of the pixel is used, the representative point can be expressed as (4, 3)+ (0.1, −0.2). Thus, a representative point on the contour line can be determined with sub-pixel accuracy from the image obtained by observing the mask 8.

Next, a method for determining a beam irradiation point will be described.

Figure 5:
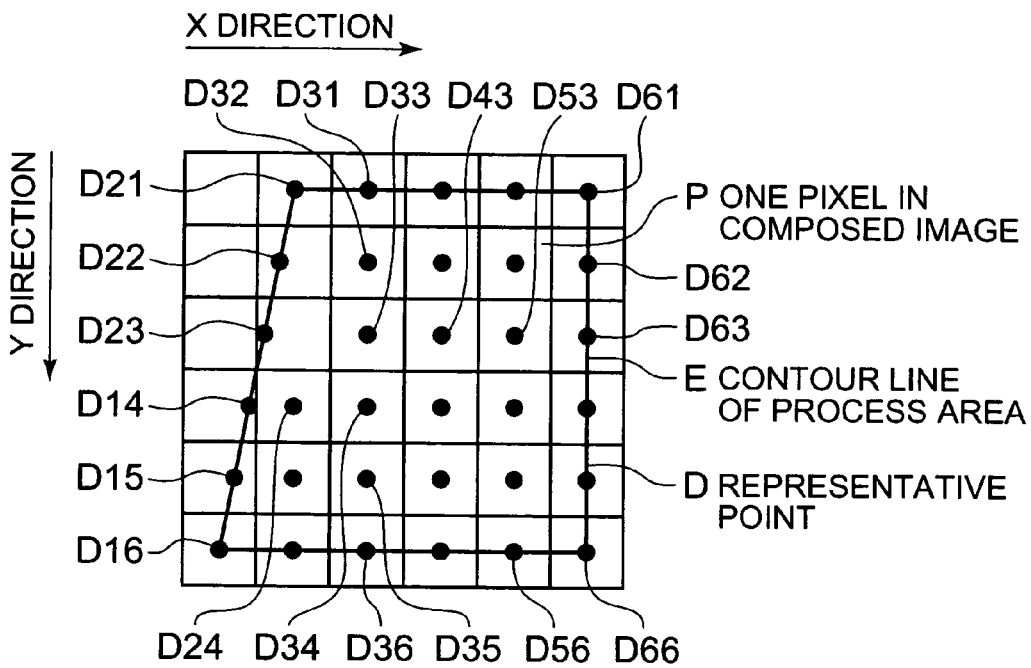
FIG. 5 shows representative points before position correction according to the first embodiment.

FIG. 5 shows the positions of representative points before correction for determining beam irradiation points.

According to the method mentioned above, for a pixel that includes a contour line E of a process area, the representative point setting means 25 of the computer 13 sets a representative point D on the contour line E. For a pixel within the process area, the center position of the pixel is set as a representative point D. In the following description, a representative point D of the pixel in the column i in the X direction and in the row j in the Y direction will be referred to as a representative point Dij.

In FIG. 5, the distance between the representative point D23 of the pixel including the contour line E and the adjacent representative point D33 is larger than the distance between adjacent representative points within the process area, for example, D33 and D43. On the other hand, the distance between the representative point D14 of the pixel including the contour line E and the adjacent representative point D24 is smaller than the distance between adjacent representative points within the process area.

Even when the ion beam 2 is exactly applied to a beam irradiation position, in practice, a broadened area of the workpiece is irradiated with the ion beam 2 and processed accordingly. Thus, when the beam irradiation is not performed uniformly within the process area, there is a problem that the workpiece will not be uniformly processed. For a scraping process of a workpiece, for example, when the distance between the irradiation positions of adjacent beams is small, the beams overlap more and hence the workpiece will be scraped deeper than the surrounding areas. On the other hand, when the distance between the irradiation positions of adjacent beams is large, the beams overlap less and hence the workpiece will be scraped shallower than the surrounding areas, or the beams do not overlap at all, leaving an unprocessed area on the workpiece.

Therefore, a representative point D will be corrected in the following manner.

Figure 6:
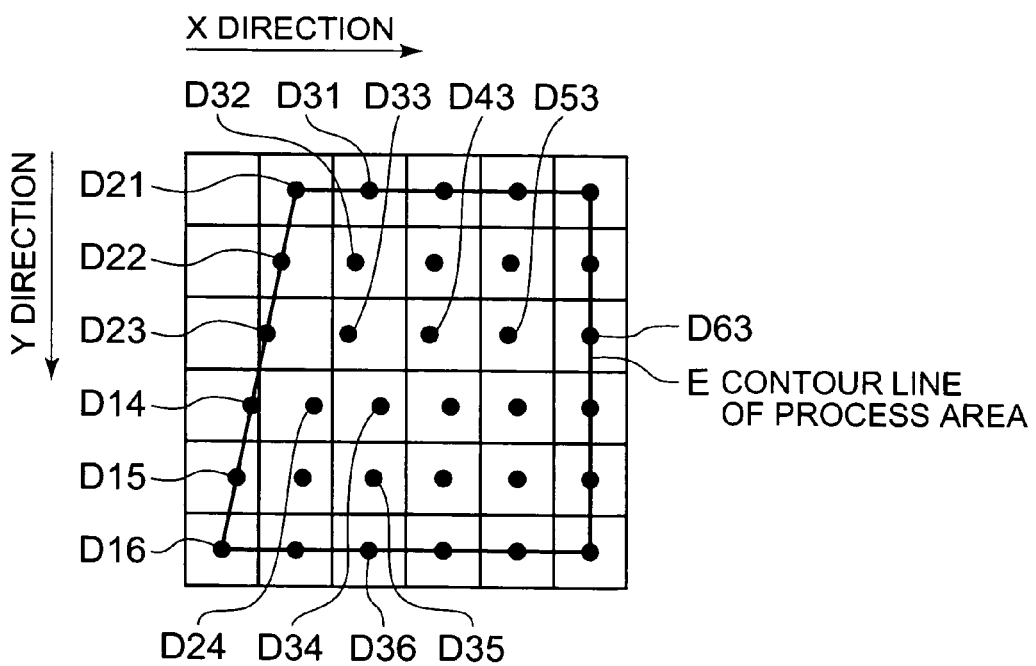
FIG. 6 shows representative points after position correction according to the first embodiment.
Figure 7:
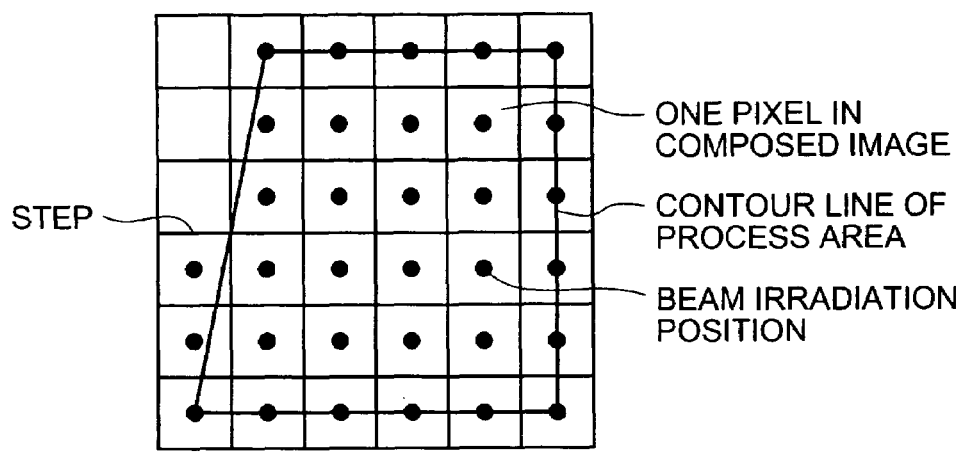
FIG. 7 shows beam irradiation positions in a related art.
Figure 8:
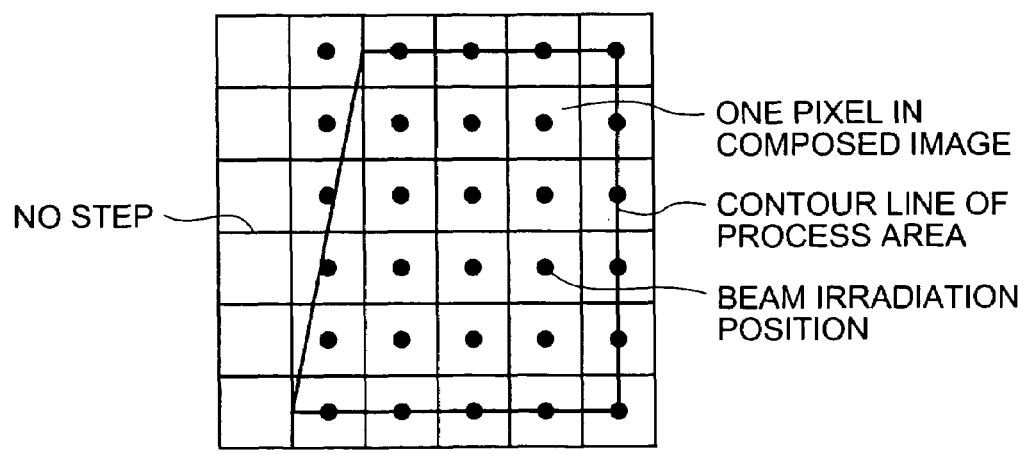
FIG. 8 shows beam radiation positions in a related art.

FIG. 6 shows the positions of representative points after correction.

When correcting a representative point D, the correcting means 26 of the computer 13 only corrects the position of the representative point D of a pixel that is not on the contour line E but within the process area, while not changing a representative point D on the contour line E.

Specifically, for representative points D of the pixels included in a same row of the Y direction, the positions of the representative points D within the process area are corrected such that their intervals in the X direction become uniform. For example, in the third row of the Y direction, the representative points D23 and D63 on the contour line E will not be changed, while the positions of the representative points D33, D43 and D53 are corrected with sub-pixel accuracy by not moving Y coordinates but the X coordinates such that, for the representative points D23, D33, D43, D53 and D63, the intervals between the X coordinates of adjacent representative points become the same.

Furthermore, for representative points D included in a same column X, the positions of the representative points D within the process area are corrected such that their intervals in the Y direction become uniform. For example, in the third row of the X direction, the representative points D31 and D36 on the contour line E will not be changed, while the positions of the representative points D32, D33, D34 and D35 are corrected with sub-pixel accuracy by not moving X coordinates but the Y coordinates such that, for the representative points D31, D32, D33, D34, D35 and D36, the intervals between the Y coordinates of adjacent representative points become the same.

The representative points D after the correction become the beam irradiation points, that is, the actual positions to which the beam is applied. Alternatively, the Y coordinates may be first corrected and then the X coordinates are corrected.

The correction of representative points described above reduces beam irradiation nonuniformity due to excess or shortage in distance between a representative point on the contour line E and an adjacent representative point, allowing the process area to be uniformly processed.

Second Embodiment

Differences from the First Embodiment will be Described Below.

In the second embodiment, beam irradiation is carried out without correcting the positions of representative points determined in the first embodiment.

That is, as described in the first embodiment, the representative point setting means 25 of the computer 13 determines representative points on the contour line of the process area with sub-pixel accuracy, while for the pixels within the process area that do not include the contour of the process area, setting center points of these pixels for beam irradiation as representative points. Then, without correcting the positions of thus determined representative points, the scanning control means 27 controls the scanning circuit 12 to apply the ion beam 2 to the uncorrected beam irradiation points.

In this case, the scanning control means 27 applies the beam in a loop around the contour line for the representative points (beam irradiation points) of the pixels that includes the contour line of the process area (for example, in FIG. 5, in order of the representative points D21, D31, . . . , D61, D62, . . . , D66, D56, . . . , D16, D15, D14, D23 and D22), while applies the beam to the center positions of the pixels for the pixels within the irradiation area in a conventional manner, such as raster scanning.

In the above embodiments, although the charged particle beam apparatus is an ion beam irradiation apparatus, it may be an electron beam irradiation apparatus or the like.

The computer 13 has a computer system therein. The operation process of the image forming means 22, the representative point setting means 25, the correction means 26 and the scanning control means 27 described above is stored on a computer readable recording medium in the form of a program. The computer system reads out the program and executes it to perform the above process. The computer system used herein includes an OS and hardware, such as peripheral devices.

The "computer system" includes, if it uses the WWW system, a website providing environment (or displaying environment).

The "computer readable recording medium" is a portable medium such as a flexible disc, magneto-optical disc, ROM and CD-ROM, and a storage device, such as a hard disk, built in the computer system. Furthermore, the "computer readable recording medium" may also include a medium that dynamically holds a program for a short period of time, such as a communication line when a program is transmitted via a network such as the Internet or a communication network such as a telephone network, and a medium that holds a program for a fixed period of time, such as a volatile memory in a computer system serving as a server or client in the above situation. The program may be a program that accomplish part of the above functions, or may be a program that can accomplish the above functions in combination with a program that has been already stored in the computer system.

What is claimed is:

1. A charged particle beam irradiation method for processing and observing a workpiece by using a charged particle beam apparatus to apply a charged particle beam to a pixel that is a unit area for charged particle beam irradiation comprising the steps of:

setting a process area based on an image obtained by observing the workpiece and determining the positions of representative points that form a contour of the set process area for each pixel with sub-pixel accuracy that is more accurate than a pixel accuracy, the position of each of the representative points being able to be set to either the center position of the pixel or a position displaced therefrom; and applying the charged particle beam, for the pixels that include the contour of the process area, to the positions of the representative points that form the contour with sub-pixel accuracy.

2. The charged particle beam irradiation method according to claim 1, wherein the method further comprises the step of applying the charged particle beam to the center position of a pixel when the pixel is within the process area.

3. The charged particle beam irradiation method according to claim 1, wherein the method further comprises the step of, for the pixels within the process area, correcting the positions of representative points for each row and column with sub-pixel accuracy such that intervals between the representative points of the pixels in a same row or column become uniform; and applying the charged particle beam to the positions of the corrected representative points.

4. A charged particle beam apparatus for processing and observing a workpiece by applying a charged particle beam to a pixel that is a unit area for charged particle beam irradiation, wherein the apparatus comprises:

representative point setting means that sets a process area based on an image obtained by observing the workpiece, and determines the positions of representative points that form a contour of the thus set process area for each pixel with sub-pixel accuracy that is better than a pixel, the position of each of the representative points being able to be set to either the center position of the pixel or a position displaced therefrom; and scanning control means that, for the pixels that include the contour of the process area, controls the charged particle beam with sub-pixel accuracy to be applied to the positions of the contour-forming representative points determined by the representative point setting means.

5. The charged particle beam apparatus according to claim 4, wherein the apparatus further comprises correction means that, for the pixels within the process area, corrects the positions of representative points for each row or column with sub-pixel accuracy such that intervals between the representative points of the pixels in a same row or column become uniform, the scanning control means controlling the charged particle beam with sub-pixel accuracy to be applied to the positions of the representative points corrected by the correction means.

* * * * *